(12) United States Patent
Kim et al.

(10) Patent No.: US 11,296,210 B2
(45) Date of Patent: Apr. 5, 2022

(54) SYMMETRICAL TWO-DIMENSIONAL FIN STRUCTURE FOR VERTICAL FIELD EFFECT TRANSISTOR AND METHOD FOR MANUFACTURING THE SAME

(71) Applicant: SAMSUNG ELECTRONICS CO., LTD., Suwon-si (KR)

(72) Inventors: Seon-Bae Kim, Hwaseong-si (KR);
Seung Hyun Song, Hwaseong-si (KR);
Young Chai Jung, Anyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 129 days.

(21) Appl. No.: 16/824,196

(22) Filed: Mar. 19, 2020

(65) Prior Publication Data

US 2021/0111271 A1    Apr. 15, 2021

Related U.S. Application Data

(60) Provisional application No. 62/913,408, filed on Oct. 10, 2019.

(51) Int. Cl.
| | |
|---|---|
| *H01L 29/66* | (2006.01) |
| *H01L 21/308* | (2006.01) |
| *H01L 29/06* | (2006.01) |
| *H01L 21/033* | (2006.01) |

(52) U.S. Cl.
CPC .... *H01L 29/66666* (2013.01); *H01L 21/0337* (2013.01); *H01L 21/3086* (2013.01); *H01L 29/0657* (2013.01); *H01L 29/6653* (2013.01); *H01L 29/6656* (2013.01)

(58) Field of Classification Search
CPC .............. H01L 21/308; H01L 21/3081; H01L 21/3083; H01L 21/3086; H01L 21/3088; H01L 21/823431; H01L 21/823487; H01L 21/823821; H01L 21/823885; H01L 21/845; H01L 29/66666;
(Continued)

(56) References Cited

U.S. PATENT DOCUMENTS

| | | |
|---|---|---|
| 5,563,077 A | 10/1996 | Ha |
| 7,148,541 B2 | 12/2006 | Park et al. |
| 9,204,538 B2 * | 12/2015 | Lee ..................... H01L 21/3086 |

(Continued)

*Primary Examiner* — Bryan R Junge
(74) *Attorney, Agent, or Firm* — Sughrue Mion, PLLC

(57) ABSTRACT

A method for manufacturing a fin structure of a vertical field effect transistor (VFET) includes: (a) patterning a lower layer and an upper layer, deposited on the lower layer, to form two patterns extended in two perpendicular directions, respectively; (b) forming a first spacer and a second spacer side by side in the two patterns along sidewalls of the lower layer and the upper layer exposed through the patterning; (c) removing the first spacer, the second spacer and the upper layer above a level of a top surface of the lower layer, and the first spacer below the level of the top surface of the lower layer and exposed through the two patterns in the plan view; (d) removing the lower layer, the upper layer, and the second spacer remaining on the substrate after operation (c); and (e) etching the substrate downward except a portion thereof below the first spacer remaining on the substrate after operation (d), and removing the remaining first spacer, thereby to obtain the fin structure.

18 Claims, 15 Drawing Sheets

(58) Field of Classification Search
CPC .......................... H01L 29/66712–66734; H01L 29/66795–66818; H01L 29/785–7856
See application file for complete search history.

(56) References Cited

U.S. PATENT DOCUMENTS

| | | |
|---|---|---|
| 9,859,276 B2 | 1/2018 | Chien et al. |
| 9,893,191 B2 | 2/2018 | Wen et al. |
| 10,170,473 B1 | 1/2019 | Zang et al. |
| 10,332,983 B1 | 6/2019 | Cheng et al. |
| 2010/0167502 A1* | 7/2010 | Yen .................... H01L 21/0337 |
| | | 438/478 |
| 2017/0200786 A1 | 7/2017 | Zang et al. |
| 2019/0148516 A1* | 5/2019 | Zhang ............... H01L 29/66666 |
| | | 257/329 |
| 2019/0198669 A1 | 6/2019 | Park et al. |

\* cited by examiner

SYMMETRICAL TWO-DIMENSIONAL FIN STRUCTURE FOR VERTICAL FIELD EFFECT TRANSISTOR AND METHOD FOR MANUFACTURING THE SAME

CROSS-REFERENCE TO THE RELATED APPLICATION

This application claims priority from U.S. Provisional Application No. 62/913,408 filed on Oct. 10, 2019 in the U.S. Patent and Trademark Office, the disclosure of which is incorporated herein in its entirety by reference.

BACKGROUND

1. Field

Apparatuses and methods consistent with exemplary embodiments of the inventive concept relate to a fin structure for a vertical field effect transistor (VFET) having a two-dimensional (2D) shape in a plan view, more particularly to, a method for manufacturing the same and a fin structure manufactured by this method.

2. Description of the Related Art

In a VFET, a current flows through a channel formed at a fin structure protruded from a substrate in a vertical direction unlike the related art planar FET or finFET. The vertically protruded fin structure is wrapped by a gate structure, and a bottom source/drain (S/D) region and a top S/D region are formed around at a bottom portion and a top portion of the fin structure, respectively.

Although a VFET device including the VFET is known as having various advantages including a high-density structure with a reduced size over related-art planar FET devices or finFET devices, a more improved VFET structure, particularly, a structure of a fin of the VFET, and improved methods of manufacturing such VFET structure are required.

SUMMARY

Various embodiments of the inventive concept provide methods for manufacturing a fin structure for a VFET, the fin structure having a 2D shape in a plan view, and fin structures for the VFET manufactured by these methods.

According to an aspect of an exemplary embodiment, there is provided a method for manufacturing at least one fin structure for a VFET, which may include the following operations: (a) forming a first layer on a substrate, the first layer having at least one first pattern, the pattern extending in a first direction with a constant first width (CD2) and penetrating the first layer so that a top surface of the substrate is exposed through the first pattern in the first direction; (b) forming a second layer on the first layer so that the second layer is formed on a top surface of the first layer and fills in the first pattern; (c) forming a third layer on a top surface of the second layer, the third layer having at least one mask pattern traversing the first pattern, extending in a second direction, different from the first direction, with a constant second width (CD3), and penetrating the third layer so that a top surface of the second layer is exposed through the mask pattern in the second direction; (d) patterning the second layer along the mask pattern using the third layer as mask so that the mask pattern penetrates the second layer to form at least one second pattern corresponding to the mask pattern, the top surface of the first layer is exposed through the second pattern, and the top surface of the substrate is exposed through the first pattern and the second pattern; (e) removing the third layer; (f) forming a first spacer along sidewalls of the first layer and the second layer exposed through the first pattern and the second pattern; (g) forming a second spacer along sidewalls of the first spacer; (h) removing the first spacer formed above the top surface of the first layer and between the second layer and the second spacer, and the first spacer below the top surface of the first layer and exposed through the first pattern and the second pattern in a plan view; (i) removing the second layer and the second spacer formed above a level of the top surface of the first layer; (j) removing the first layer, the second layer and the second spacer above a level of the top surface of the substrate; and (k) etching the substrate downward except a portion thereof below the first spacer left from operation (j), and removing the first spacer left from operation (j), thereby obtaining the fin structure.

According to another aspect of an exemplary embodiment, there is provided a method for manufacturing at least one fin structure for a VFET, which may include the following operations: (a) stacking, on a substrate, a plurality of layers comprising a lower layer and an upper layer respectively having at least one first pattern and at least one second pattern extending in different directions traversing each other to expose the substrate therethrough; (b) forming a first spacer on sidewalls of the layers exposed through the first pattern and the second pattern; (c) forming a second spacer on sidewalls of the first spacer; (d) removing the first spacer, the second spacer, and the upper layer above a level of a top surface of the lower layer, and the first spacer below the level of the top surface of the lower layer and exposed through the first pattern and the second pattern in a plan view; (e) removing the layers and the second spacer remaining on the substrate after operation (d); and (f) etching the substrate downward except a portion thereof below the first spacer remaining on the substrate after operation (e), and removing the remaining first spacer, thereby to obtain the fin structure.

According to another aspect of an exemplary embodiment, there is provided a fin structure for a VFET which may include a first sub-fin structure and a second sub-fin structure protruded from a substrate, wherein the first sub-fin structure and a second sub-fin structure are symmetrical to each other on the substrate in a plan view. The first sub-fin structure and the second sub-fin structure may be separated from each other or connected to each other on the substrate.

BRIEF DESCRIPTION OF THE DRAWINGS

The above and other aspects of inventive concepts will become more apparent to those of ordinary skill in the art by describing in detail example embodiments thereof with reference to the accompanying drawings, in which:

FIGS. 3A and 3B through 13A and 13B illustrate a method for manufacturing fin structures for a VFET according to an embodiment.

DETAILED DESCRIPTION

Figure 1A:
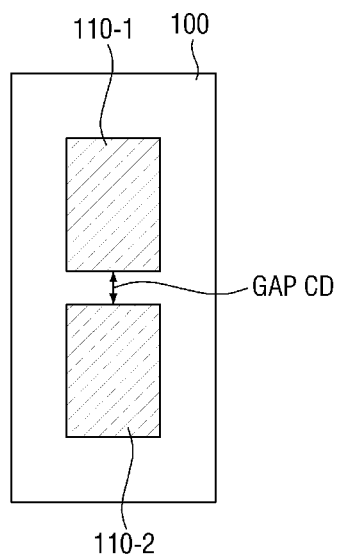
FIGS. 1A through 1E illustrate a method of manufacturing a fin structure for a VFET in the plan view, according to an embodiment.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Performance of a multi-dimensional semiconductor device such as FinFET and VFET can be improved by increasing a Z-direction length of the device, compared to a planar device such as planar FET. For example, gate controllability of a VFET may be improved by increasing a height of a fin structure measured from a substrate. However, the height of the fin structure may be limited because of the limitation of the entire size of the VFET. Thus, a fin structure having a two-dimensional (2D) shape such as "H" character, "E" character or "+" symbol in a plan view of the substrate, that is, when viewed from top, is introduced because its x- and y-direction lengths can add up the size of the fin structure to have a greater current path between a bottom S/D region and a top S/D region of the VFET.

FIGS. 1A through 1E illustrate a method of manufacturing a fin structure of a VFET protruded from a substrate and having a two-dimensional (2D) shape such as the "H" character in a plan view of the substrate, according to an embodiment.

Referring to FIG. 1A, a substrate 100 is provided with a pair of rectangular mandrels 110-1 and 110-2 having a gap of a critical dimension (hereafter "gap CD") which may define a critical dimension of a fin structure to be formed according to the present embodiment.

The mandrels 110-1 and 110-2 may be formed on the substrate 100 through lithographing and etching process so that the mandrels 110-1 and 110-2 may have a protrusion shape protruded from the substrate 100, although a cross-sectional view of the substrate 100 with the mandrels 110-1 and 110-2 thereon is omitted herein. Further, there may be provided one or more hard mask layers (not shown) between the substrate 100 and the mandrels 110-1 and 110-2 although not shown in FIGS. 1A through 1E.

The substrate 100 may be formed of a single element semiconductor material such as silicon (Si), germanium (Ge), etc., not being limited thereto, or their compound (SiGe). The substrate 100 may be a doped or undoped layer. The mandrels 110-1 and 110-2 may be formed of a spin-on-hard mask (SOH) material including a silicon-based organic material, not being limited thereto. A variety of different amorphous silicon materials may be used to form the mandrels 110-1 and 110-2 as long as the mandrels 110-1 and 110-2 have etch selectivity with respect to a spacer to be formed on side surfaces, i.e., sidewalls, of the mandrels 110-1 and 110-2 and above the fin structure in following steps of the method according to the present embodiment.

Figure 1B:
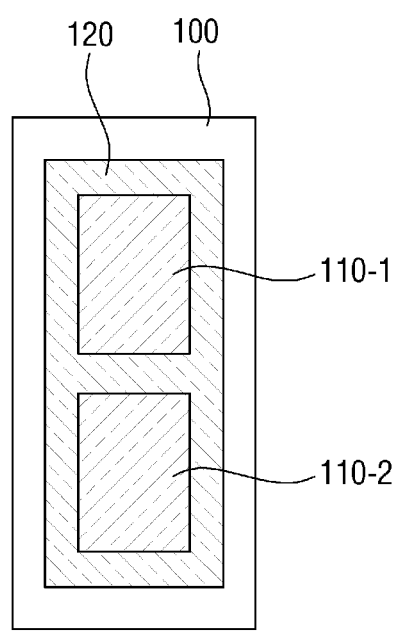

FIG. 1B shows that a spacer 120 is formed on side surfaces of the mandrels 110-1 and 110-2, and the spacer 120 fills the gap having the gap CD between the mandrels 110-1 and 110-2. The spacer 120 may be formed by depositing a spacer material such as silicon oxide (SiO) on the mandrels 110-1 and 110-2 to cover top surfaces and the side surfaces thereof, and etching away the spacer material deposited on the top surfaces to expose the top surfaces to the outside and leave the spacer material at the side surfaces of the mandrels 110-1 and 110-2.

The process of depositing the spacer material may be performed by a thin film deposition technique such as atomic layer deposition (ALD), not being limited thereto, so that the spacer 120 can have a same width along the side surfaces of the mandrels 110-1 and 110-2, which may a required dimension for a desired fin structure to be formed according to the present embodiment. The etching process used in the present step may be anisotropic etching or plasma etching, not being limited thereto, according to the inventive concept. The spacer material forming the spacer 120 may also not be limited to SiO as long as the spacer material has etch selectivity with respect to the material forming the mandrels 110-1 and 110-2.

Figure 1C:
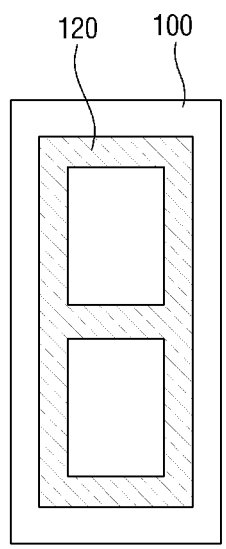

FIG. 1C shows that the mandrels 110-1 and 110-2 enclosed by the spacer 120 are removed by another etching process such as dry etching, not being limited thereto, to leave the spacer 120, formed at the side surfaces of the mandrels 110-1 and 110-2, on the substrate 100.

Figure 1D:
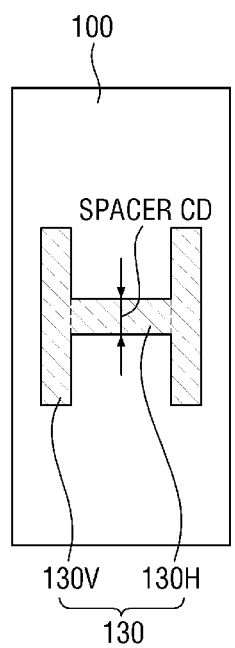

FIG. 1D shows that the spacer 120 is cut or etched away at two opposite sides in a length direction to form an H-shaped spacer 130, that is, a spacer having a shape of character "H" having a desired dimension in the plan view. It is noted here that the gap CD shown in FIG. 1A is transferred to a critical dimension of the H-shaped spacer 130 (hereafter "spacer CD") because of the lithography, deposition and etching processes shown in FIGS. 1A through 1C. The spacer CD of the H-shaped spacer 130 represents a width of a horizontal portion 130H of the H-shaped spacer 130, and may be equal to the gap CD which will define the critical dimension of the fin structure, in the plan view, to be formed in the next step. Further, the width of the horizontal portion 130H of the H-shaped spacer 130 may be equal to a width of a vertical portion 130V of the H-shaped spacer 130.

Figure 1E:
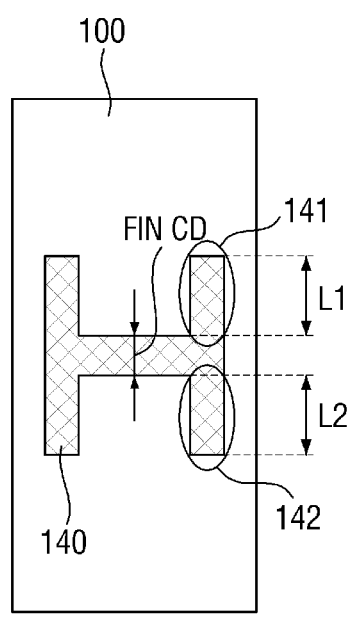

FIG. 1E shows that, using the H-shaped spacer 130 as a hard mask layer, the substrate 100 is etched downward, and the H-shaped spacer 130 is also removed by etching, thereby forming an H-shaped fin structure 140 which is vertical with respect to the substrate 100 and also has a shape of character "H." A bottom source/drain region is then formed in the substrate 100 beneath the H-shaped fin structure 140. Here, the spacer CD is transferred to a critical dimension of the H-shaped fin structure 140 (hereafter "fin CD"). Thus, the gap CD shown in FIG. 1A is finally transferred to and define the fin CD. The etching process used to obtain the H-shaped fin structure 140 herein may be dry etching, but not limited thereto, according to the inventive concept.

According to the above embodiment, a 2D-shaped fin structure such as the H-shaped fin structure 140 may be obtained to provide a better performance to a VFET. However, there is a limit in scaling the fin CD through the above processes, and also, two symmetrical portions 141 and 142 of the H-shaped fin structure 140 may not have an equal length due to process distribution during manufacturing of this 2D-shaped fin structure. That is, a length L1 and a length L2 may not be the same after formation of the H-shaped fin structure 140 on the substrate 100, whereby the portions 141 and 142 may not provide consistent current paths to the VFET.

Thus, a method of manufacturing a fin structure of a VFET with two symmetrical portions having a same length is described hereafter.

Figure 2:
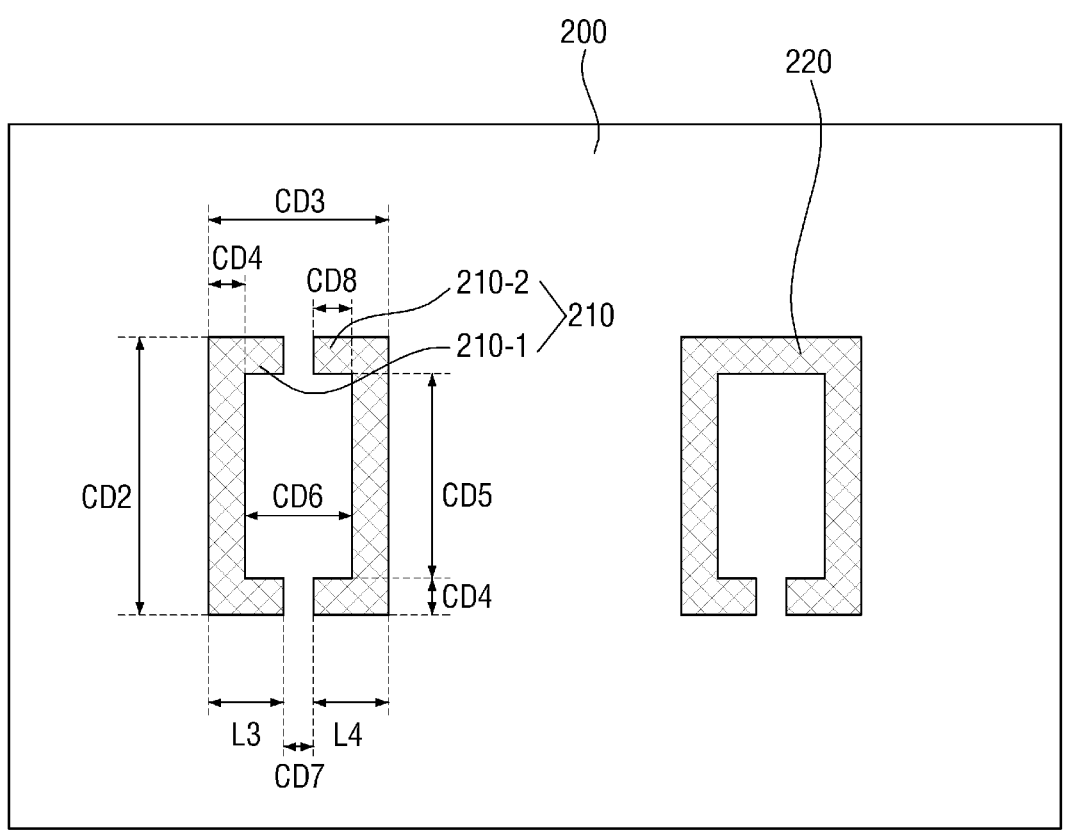
FIG. 2 illustrates a plan view of 2D-shaped fin structures to be manufactured for a VFET according to an embodiment.

FIG. 2 illustrates a plan view of 2D-shaped fin structures to be manufactured for a VFET according to an embodiment.

Referring to FIG. 2, a first fin structure 210 and a second fin structure 220 are protruded on a substrate 200.

The first fin structure 210 has two sub-fin structures 210-1 and 210-2 separated from each other and symmetrical to each other with respect to a Y-direction center line (not shown) on the substrate 200. The sub-fin structure 210-1 includes two horizontal portions having a same length L3 and connected by a vertical portion which is defined by a critical dimension 5 (CD5) in the Y-direction and a critical dimension 4 (CD4) in the X-direction. Here, the CD4 represents a width of the vertical portion of the sub-fin structure 210-1 in the X-direction. The CD4 is shorter than the length L3. The CD4 may also represents a width of the horizontal portion of the sub-fin structure 210-1. The sub-fin structure 210 is also defined by a critical dimension (CD2) which is its Y-direction length.

The sub-fin structure 210-2 also includes two horizontal portions having a same length L4 and connected by a vertical portion which also is defined by the same critical dimensions CD4 and CD5. It is noted here that the length L3 of each of the horizontal portions of the sub-fin structure 210-1 is equal to the length L4 of each of the horizontal portions of the sub-fin structure 210-2. Thus, the first fin structure 210 is divided by two symmetrical portions at least with respect to the Y-direction center line. Specifically, FIG. 2 shows that two "C" character-shaped fin structures, that is, the sub-fin structure 210-1 and the sub-fin structure 210-2, symmetrically facing each other in the plan view are formed on the substrate 200.

The first fin structure 210 is also defined by critical dimensions CD6, CD7 and CD8 as described later.

The second fin structure 220 is formed in the same shape as the first fin structure 210, except that its upper horizontal portions of the second fin structure 220 are connected to each other, and thus, the second fin structure 220 takes a shape of an open loop in the plan view of the substrate 200. Still, however, the fin structure 220 may be referred to as having two symmetrical portions at least with respect to its Y-direction center line (not shown).

Hereafter, a method for manufacturing the first fin structure 210 and the second fin structure 220 is provided.

FIGS. 3A and 3B through 12A and 12B illustrate a method for manufacturing fin structures for a VFET according to an embodiment. FIGS. 3A through 13A are perspective views of a substrate on which fin forming operations are applied, and FIGS. 3B through 13B are corresponding plan views of the substrate.

Figure 3A:
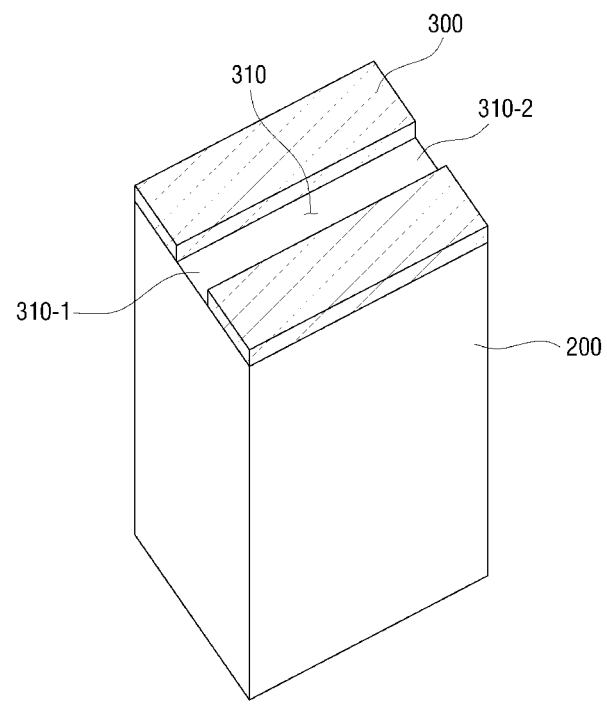
Figure 3B:
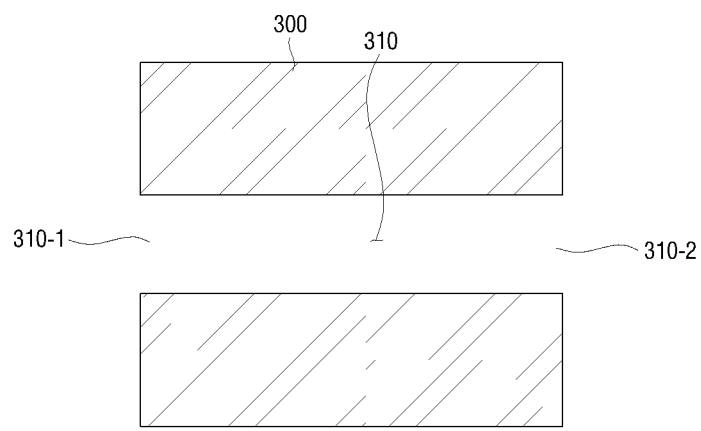

Referring to FIGS. 3A and 3B, a first layer 300 is deposited on a top surface of the substrate 200, and then, is patterned in a first direction to form a first pattern 310 penetrating through the first layer 300 with a constant width which defines the CD2 shown in FIG. 2. The first pattern 310 is open at two ends 310-1 and 310-2 at the first layer 300. However, the inventive concept is not limited thereto. According to an embodiment, at least one of the two ends 310-1 and 310-2 may not be open in the first pattern 310, and only the end 310-1 or 310-2 may be closed while the other is open in the first pattern 310. The first pattern 310 thus formed may expose the top surface of the substrate therethrough in a plan view of the substrate 200.

Although FIGS. 3A and 3B show that the first layer 300 is first deposited on the substrate 200, and then, the first pattern 310 is formed thereon, the first layer 300 may be formed such that two portions thereof are deposited on the substrate with a gap of the CD2 to expose the top surface of the substrate 200 along the gap of the CD2 corresponding to the first pattern 310, according to an embodiment.

The first layer 300 may have a flat top surface, and may be formed of amorphous silicon materials, polysilicon, silicon oxide (SiO) and/or silicon nitride, not being limited thereto, according to embodiments.

Figure 4A:
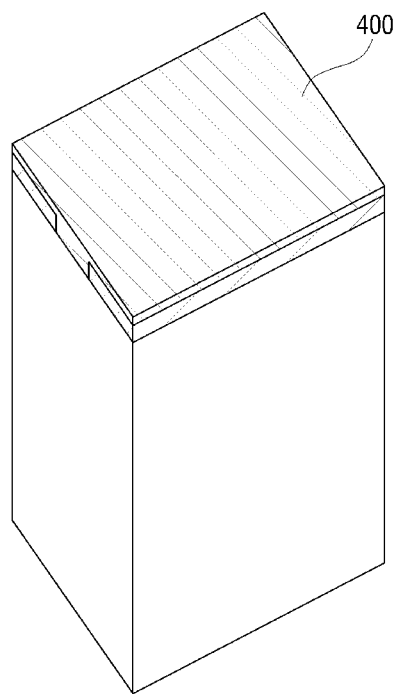
Figure 4B:
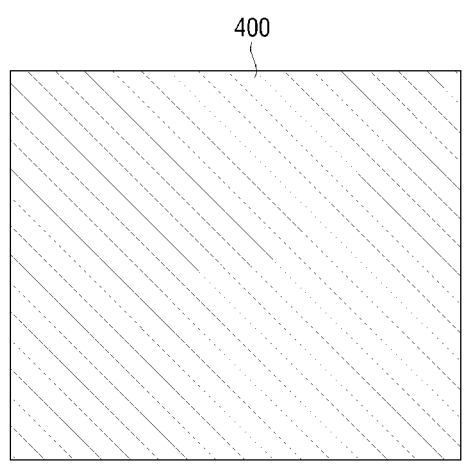

FIGS. 4A and 4B illustrate that a second layer 400 is formed on the first layer 300, according to an embodiment.

Referring to FIGS. 4A and 4B, the second layer 400 having etch selectivity with respect to the first layer 300 is deposited on the first layer 300 so that the second layer 400 covers the first layer 300 and fills in the first pattern 310. According to an embodiment, the second layer 400 may cover only a sufficient portion of the first layer 300 and completely fill in a sufficient portion of the first pattern 310 where the first fin structure 210 and the second fin structure 220 are to be formed.

After depositing the second layer 400, the second layer 400 may be planarized to be flat on a top surface thereof. According to an embodiment, chemical mechanical polishing (CMP) may be applied to the second layer 400 to flatten the top surface thereof, without being limited thereto.

According to an embodiment, the second layer 400 may be formed of polysilicon having etch selectivity with respect to the first layer 300, without being limited thereto.

Figure 5A:
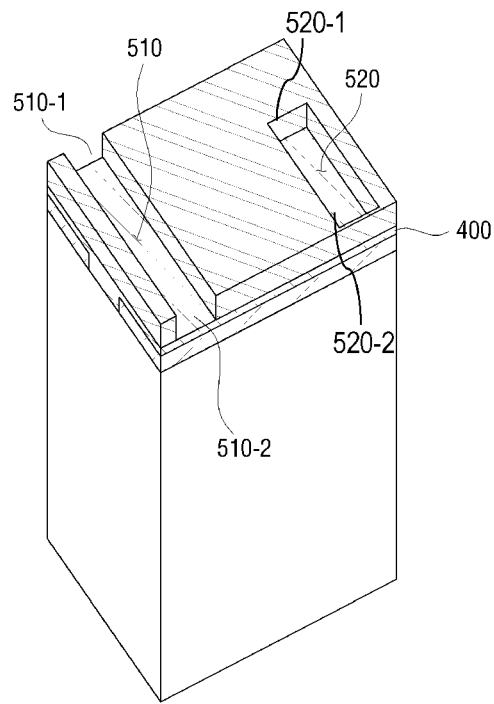
Figure 5B:
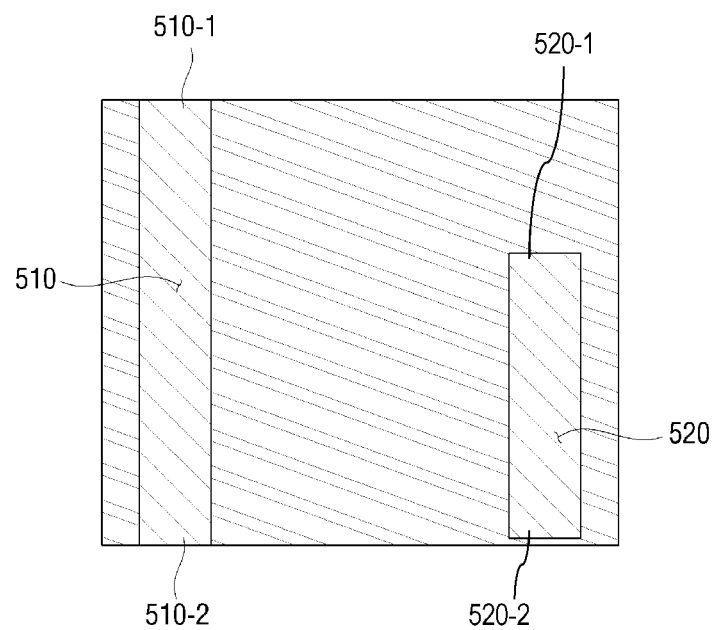

FIGS. 5A and 5B illustrate that a third layer 500 is formed on the second layer 400 which is planarized in the previous operation, according to an embodiment.

Referring to FIGS. 5A and 5B, the third layer 500 is deposited on a top surface of the second layer 400, where the third layer 500 is patterned to form two mask patterns 510 and 520 which traverse the first pattern 310 and are extended in a second direction perpendicular to the first direction in which the first pattern 310 is extended. The mask patterns 510 and 520 have a constant width which defines a CD3 and penetrate the third layer 500 so that a top surface of the second layer 400 is exposed through the mask patterns 510 and 520 in the second direction.

FIGS. 5A and 5B further shows that the mask pattern 510 and the mask pattern 520 have different shapes in the plan view. The mask pattern 510 is open at two ends 510-1 and 510-2 at the third layer 500, and the mask pattern 520 is closed at two ends 520-1 and 520-2 within the third layer 500 so that the two mask patterns 510 and 520 have different shapes in the plan view. However, the inventive concept is not limited thereto. According to embodiments, at least one of the two ends 510-1 and 510-2 may not be open in the mask pattern 510, and only the end 520-1 or 510-2 may be closed while the other is open in the mask pattern 520.

Although FIGS. 5A and 5B show that the third layer 500 is first deposited on the second layer 400, and then, the mask patterns 510 and 520 are formed thereon, the third layer 500 having the mask patterns 510 and 520 may be formed to expose the top surface of the second layer 400 therethrough, according to an embodiment.

Figure 6A:
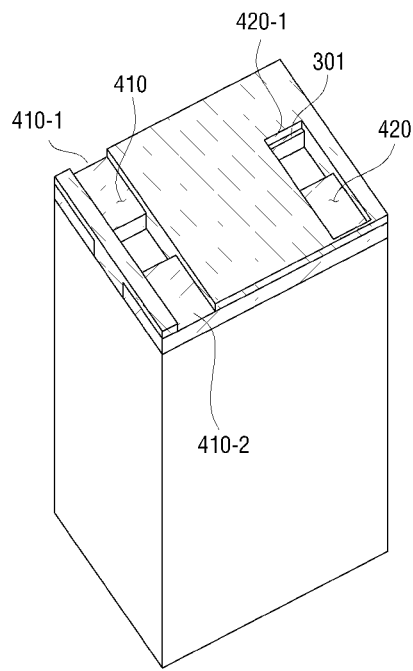
Figure 6B:
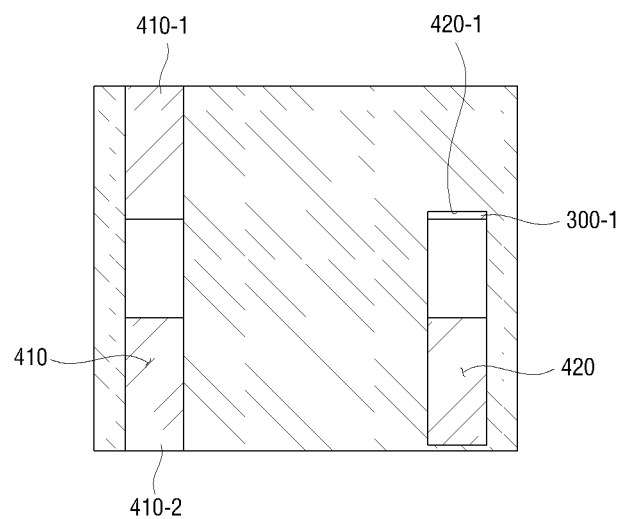

FIGS. 6A and 6B illustrate that the second layer 400 is patterned along the mask patterns 510 and 520 using the third layer 500 as a mask so that the mask patterns 510 and 520 penetrate through the second layer 400 to form second patterns 410 and 420, corresponding to the mask patterns 510 and 520, on the second layer 400 and expose the top surface of the first layer 300, according to an embodiment.

Referring to FIGS. 6A and 6B, as the second patterns 410 and 420 traverse the first pattern 310, the top surface of the substrate 200 is exposed where the second patterns 410 and 420 traverse the first pattern 310. It is noted that since the mask pattern 510 is open at the two ends 510-1 and 510-2 thereof at the third layer 500 and the mask pattern 520 is closed within the third layer 500 as shown in FIGS. 5A and 5B, patterning the second layer 400 using the mask patterns 510 and 520 results in the second pattern 410 opening at two ends 410-1 and 410-2 at the second layer 400 and the second pattern 420 being closed within the second layer 400. Accordingly, a top surface area of the first layer 300 exposed through the second pattern 410 and a top surface area of the first layer 300 exposed through the second pattern 420 are different from each other. In particular, a top surface area 301 of the first layer 300 exposed by one closed end 420-1 of the second pattern 420 may be small enough only to accommodate a portion of a first spacer 710 described later in reference to FIGS. 7A and 7B.

Next, the second layer 400 is removed to expose the top surface of the second layer 400 where the second patterns 410 and 420 are formed.

Figure 7A:
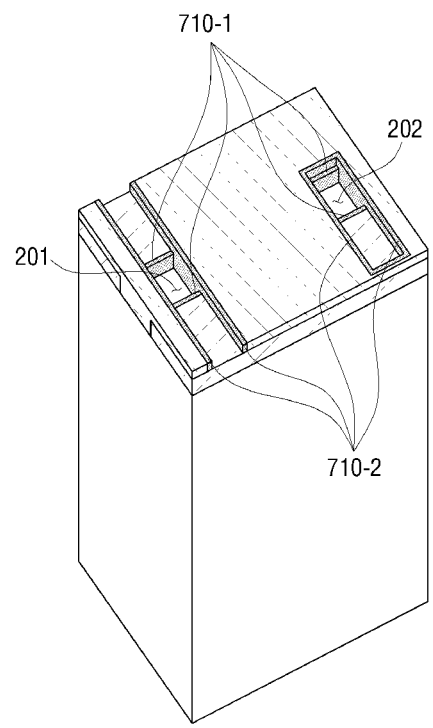
Figure 7B:
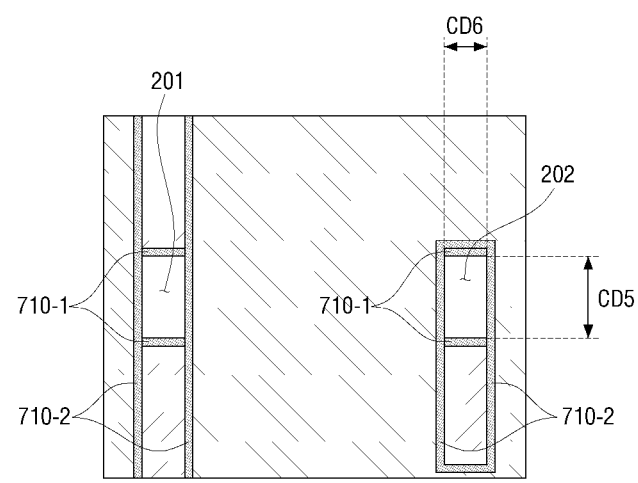

FIGS. 7A and 7B illustrate that the first spacer 710 is formed on the substrate 200 along sidewalls of the first layer 300 and sidewalls of the second layer 400, according to an embodiment.

Specifically, referring to FIGS. 7A and 7B, first portions 710-1 of the first spacer 710 are deposited on the substrate 200, exposed through the first pattern 310 and the second patterns 410 and 420, along the sidewalls of the first layer 300 and the sidewalls of the second layer 400 exposed through the first pattern 310 and the second patterns 410 and 420. After the first portions 710-1 of the first spacer 710 are deposited in this manner, the substrate 200 is exposed through the first pattern 310 and the second patterns 410 and 420 with a gap of the CD5 between the first portions 710-1 facing each other in the second direction in the first pattern 310 and a gap of the CD6 between the first portions 710-1 facing each other in the first direction in the first pattern 310.

It is noted here that top surfaces of the first portions 710-1 of the first spacer 710 may be at the same level as the top surface of the first layer 300. It is further noted that, when the first fin structure 210 and the second fin structure 220 are finally formed as shown in FIG. 2, some of the first portions 710-1 of the first spacer 710 facing each other in the second direction in the first pattern 310 below the second pattern 410 form the first fin structure 210 because the other some of the first portions 710-1 are etched away in operations of FIGS. 9A and 9B, while all of the first portions 710-1 of the first spacer 710 facing each other in the first direction in the first pattern 310 below the second patterns 410 and 420 form the second fin structure 220.

In FIGS. 7A and 7B, however, the first portions 710-1 of the first spacer 710 facing each other in the first direction in the first pattern 310 are not shown because they are formed below second portions 710-2 of the first spacer 710 to be described below.

Referring again to FIGS. 7A and 7B, the second portions 710-2 of the first spacer 710 are deposited on the first layer 300, exposed through the second patterns 410 and 420, and the top surfaces of the first portions 710-1 of the first spacer 710, facing each other in the first direction in the first pattern 310, along the sidewalls of the second layer 400 exposed through the second patterns 410 and 420. Here, the second portions 710-2 of the first spacer 710 deposited on the first layer 300 along the sidewall of the second layer 400 exposed at the closed end 420-1 may cover the top surface area 301 of the first layer 300 exposed by the closed end 420-1 shown in FIGS. 6A and 6B.

After the second portions 710-2 of the first spacer 710 are deposited in this manner, the substrate 200 is still exposed through the gaps of the CD5 and the CD6 described above because the width of each of the second portions 710-2 is the same as the width of each of the first portions 710-1 facing each other in the first direction in the first pattern 310 below the second portions 710-2. Further, it is noted that, the second portions 710-2 of the first spacer 710 deposited on the first layer 300 along the sidewalls of the second layer 400 in the second pattern 420 take a closed shape in the plan view.

Although the first portions 710-1 and the second portions 710-2 of the first spacer 710 are formed in this order according to the present embodiment, this order may be changed according to an embodiment, and further, the first portions 710-1 of the first spacer 710 facing each other in the first direction in the first pattern 310 and the second portions 710-2 of the first spacer 710 may be formed by one time deposition.

According to an embodiment, the first portions 710-1 and the second portions 710-2 of the first spacer 710 may be formed to have a constant width defining the CD4, which is to be a width of the first fin structure 210 and the second fin structure 220.

According to an embodiment, the first spacer 710 may be formed of at least one of $SiO_x$ and $SiN_x$ not being limited thereto.

Figure 8A:
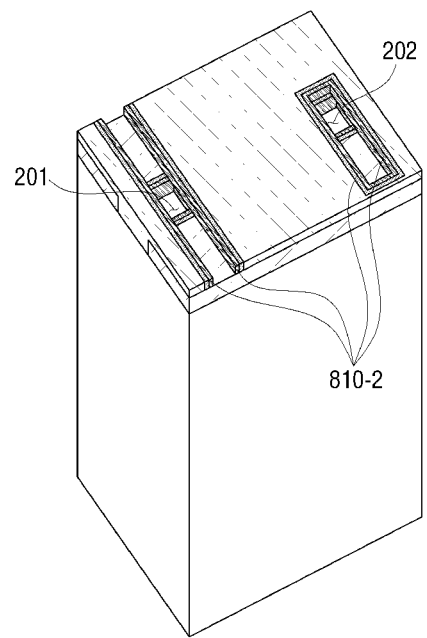
Figure 8B:
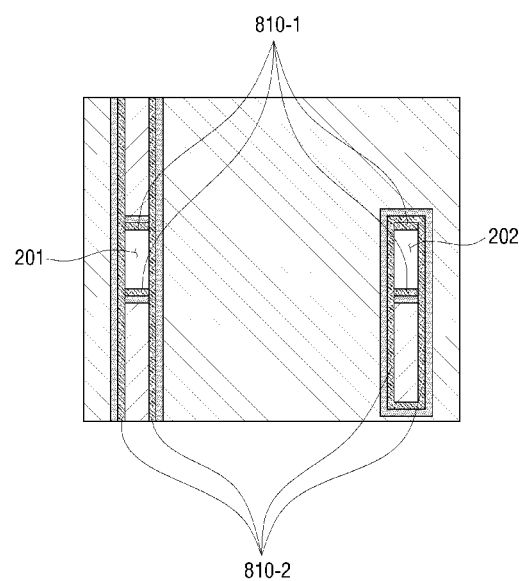

FIGS. 8A and 8B illustrate that a second spacer 810 is formed on sidewalls of the first spacer 710, according to an embodiment.

Specifically, referring to FIGS. 8A and 8B, first portions 810-1 of the second spacer 810 are deposited on the substrate, exposed through the gaps of the CD5 and the CD6 defined by the first spacer 710, along the sidewalls of the first spacer 710 facing one another in the first and second directions in the first pattern 310.

It is noted here that top surfaces of the first portions 810-1 of the second spacer 810 may be at the same level as the top surfaces of the first portions 710-1 of the first spacer 710 and the top surface of the first layer 300.

In FIGS. 8A and 8B, however, the first portions 810-1 of the second spacer 810 facing each other in the first direction in the first pattern 310 are not shown because they are formed below second portions 810-2 of the second spacer 810 to be described below.

Referring again to FIGS. 8A and 8B, the second portions 810-2 of the second spacer 810 are deposited on the first layer 300, exposed through the second patterns 410 and 420 where the second portions 710-2 of the first spacer 700 are deposited along the sidewalls of the second layer 400 exposed through the second patterns 410 and 420.

Although the first portions 810-1 and the second portions 810-2 of the second spacer 810 are formed in this order according to the present embodiment, this order may be changed according to an embodiment. For example, the first portions 810-1 of the second spacer 810 deposited on the substrate 200 along the sidewalls of the first spacer 710 in the first pattern 310 and facing each other in the first direction, and the second portions 810-2 of the second spacer 810 facing each other in the first direction may be formed by one time deposition.

It is noted that the width of the second portions 810-2 of the second spacer 810 may define the CD8 shown in FIG. 2.

According to an embodiment, the second spacer 810 may be formed of at least one of $SiO_x$ and $SiN_x$ not being limited thereto. However, the second spacer 810 may have etch selectivity against the first spacer 710 such that when the first spacer 710 includes $SiO_x$, the second spacer 810 may include $SiN_x$.

Now referring to FIG. 8B, after the second spacer 810 is deposited in the above manner, the plan view of the substrate 200, on which the first layer 300, the second layer 400, the first spacer 710 and the second spacer 810 are formed, still shows two portions 201 and 202 of the substrate 200 exposed through the gap of CD7 in the first pattern 310 and the second patterns 410 and 420. According to an embodiment, however, these two portions 201 and 202 may not be exposed by having the first portions 810-1 of the second spacer 810 deposited on these two portions 201 and 202. This is because even according to this embodiment, the first fin structure 210 and the second fin structure 220 shown in FIG. 2 can be formed.

Figure 9A:
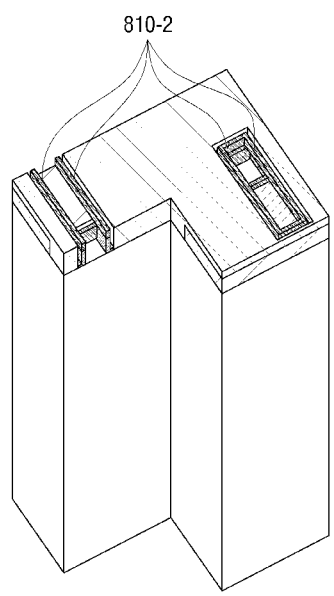
Figure 9B:
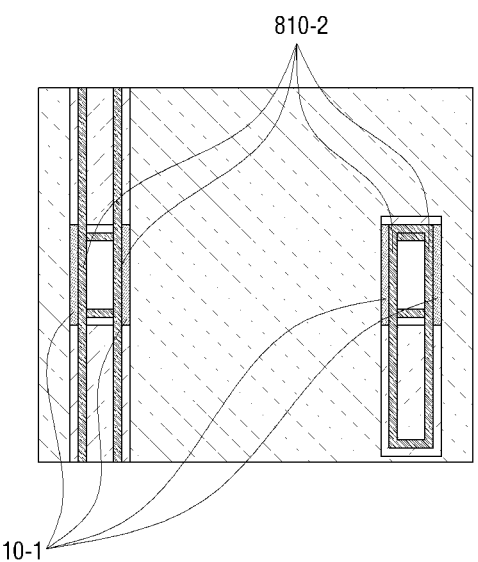

FIGS. 9A and 9B illustrate that the second portions 710-2 of the first spacer 710 above the level of the top surface of the first layer 300 are removed, and further, the first portions 710-1 of the first spacer 710 facing each other in the second direction in the first pattern 310 and exposed through the first pattern 310 and the second patterns 410 and 420 are removed. Thus, FIG. 9B shows that the first portions 710-1 of the first spacer 710, facing each other in the first direction in the first pattern 310, formed below the removed second portions 710-2 of the first spacer 710 are exposed through the first pattern 310 and the second patterns 410 and 420.

Figure 10A:
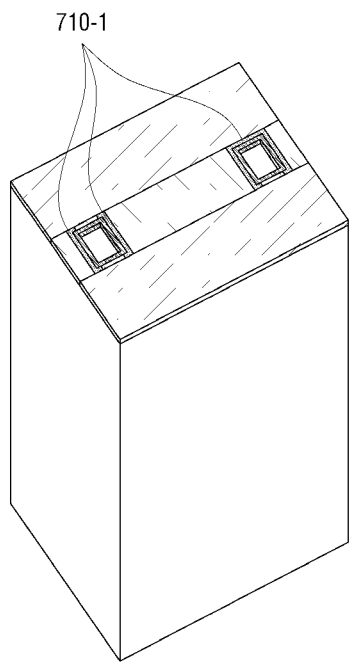
Figure 10B:
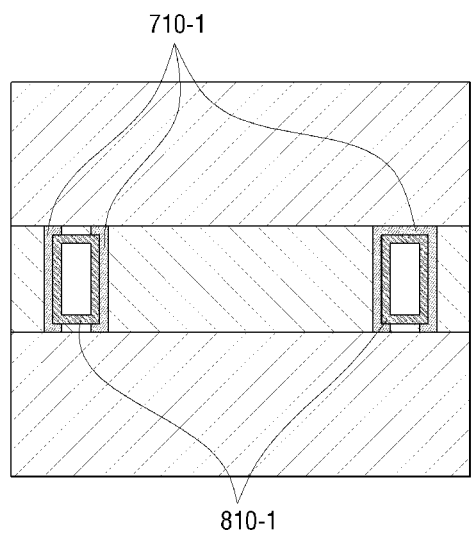

FIGS. 10A and 10B illustrate that the second layer 400 and the second spacer 810 above the level of the first layer 300 are removed to expose the top surface of the first layer 300, and top surfaces of the first portions 710-1 of the first spacer 710 remaining in the first pattern 310 after the removal operation in FIGS. 9A and 9B. In the removal operation in FIGS. 10A and 10B, the second layer 400 and the first portions 810-1 of the second spacer 810 remaining in the first pattern 310 after the removal operation in FIGS. 9A and 9B are also exposed. By this removal operation in FIGS. 10A and 10B, the second patterns 410 and 420 do not exist any longer. According to an embodiment, the removal operation used in FIGS. 10A and 10B may be CMP, not being limited thereto.

Figure 11A:
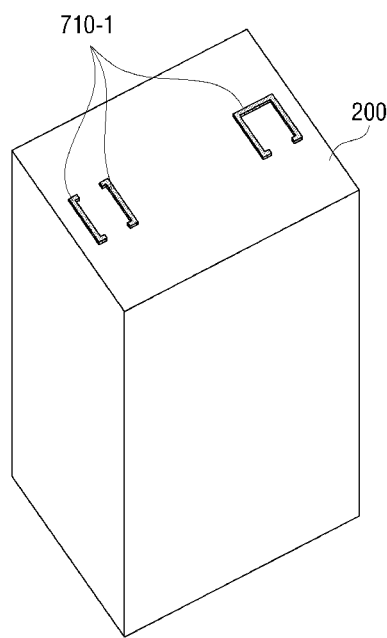
Figure 11B:
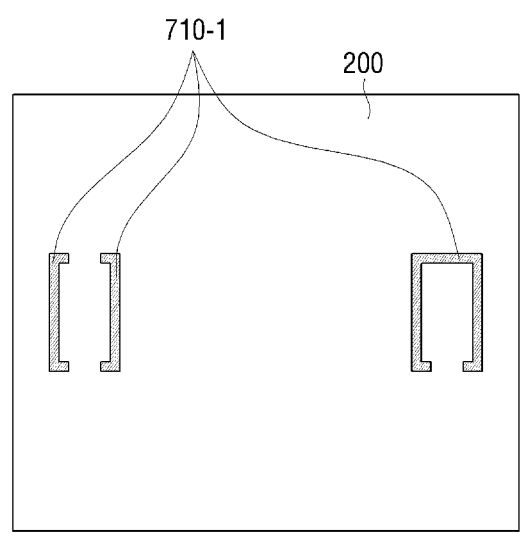

FIGS. 11A and 11B illustrate that the first layer 300, the second layer 400 and the first portions 810-1 of the second spacer 810 filled in the first pattern 310 are removed together with the first pattern 310 to leave only the first portions 710-1 of the first spacer 710 remaining after the removal operation in FIGS. 9A and 9B on the substrate 200.

According to an embodiment, the removal operation used in FIGS. 11A and 11B is dry etching and/or wet etching, not being limited thereto.

Figure 12A:
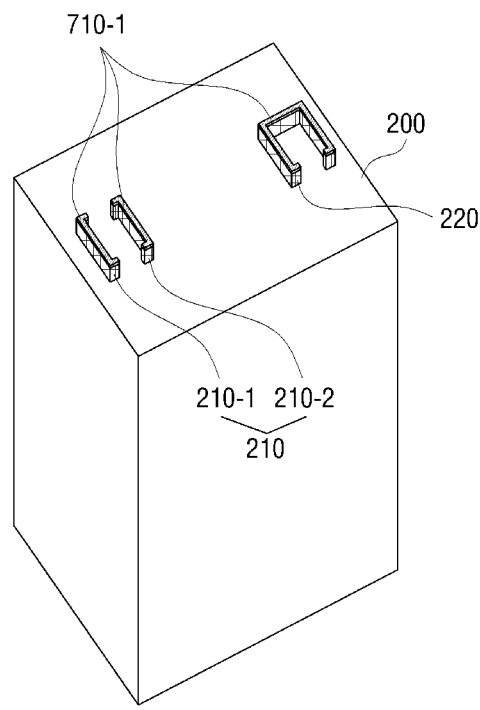
Figure 12B:
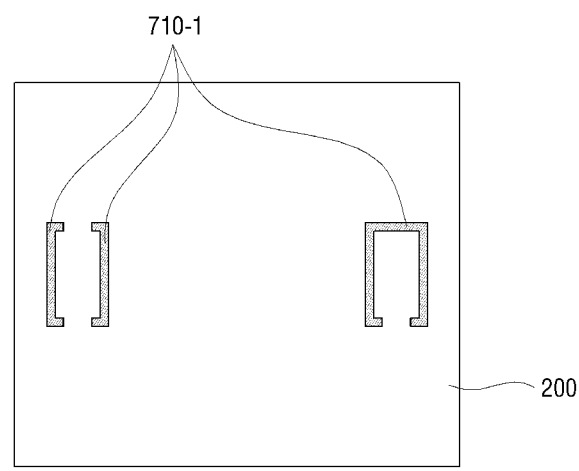

FIGS. 12A and 12B illustrate that the substrate 200 is now etched downward to a predetermined depth using, as mask, the first portions 710-1 of the first spacer 710 remaining after the removal operation in FIGS. 9A and 9B on the substrate 200. Here, the predetermined depth may define the height of the first fin structure 210 and the second fin structure 220 on the substrate 200. The etching operation used herein may be dry etching not being limited thereto, according to an embodiment. After this etching operation, the first fin structure 210 and the second fin structure 220 are formed on the substrate 200 with the first portions 710-1 of the first spacer 710 remaining after the removal operation in FIGS. 9A and 9B thereon.

Figure 13A:
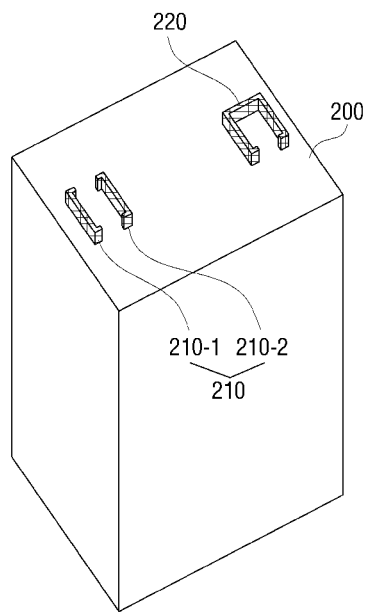
Figure 13B:
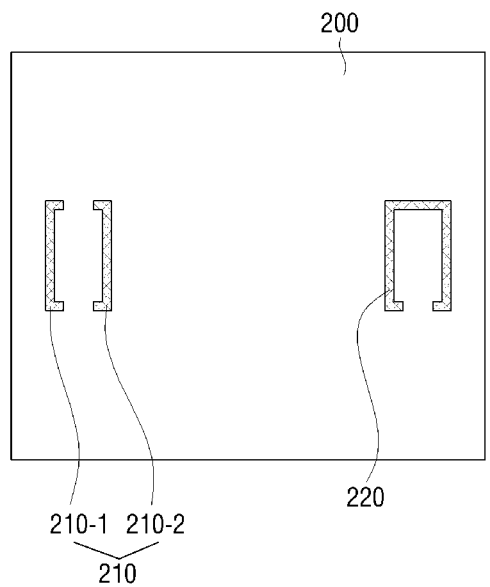

FIGS. 13A and 13B illustrate that the first portions 710-1 of the first spacer 710 remaining after the removal operation in FIGS. 9A and 9B is now removed by etching to expose the first fin structure 210 and the second fin structure 220 on the etched substrate 200 as shown in FIG. 2.

In the foregoing embodiments, the first fin structure 210 and the second fin structure 220 are simultaneously formed on the substrate 200 using the first spacer 710 and the second spacer 810 based on the first pattern 310 and the second patterns 410 and 420. However, the inventive concept is not limited thereto. According to an embodiment, each of the first fin structure 210 and the second fin structure 220 may be formed independently of the other using the first spacer 710 and the second spacer 810 based on the first pattern 310 and only one of the second patterns 410 and 420.

Also, in the foregoing embodiments, the first fin structure 210 and the second fin structure 220 are formed on the substrate 200 using the first spacer 710 and the second spacer 810 based on three patterns, that is, the first pattern 310 and the second patterns 410 and 420. However, the inventive concept is not limited thereto because two or more first patterns at the first layer 300 and three or more second patterns at the second layer 400 may be used to form more fin structures on the substrate 200.

According to the foregoing embodiments, a multi-dimensional semiconductor device such as FinFET and VFET may have its fin structure with no length deviation between sub-structures, thereby enabling manufacturing of ultrafine fin structures.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A method for manufacturing at least one fin structure of a vertical field effect transistor (VFET), the method comprising the following operations:
   (a) forming a first layer on a substrate, the first layer having at least one first pattern, the first pattern extending in a first direction with a constant first width and penetrating the first layer so that a top surface of the substrate is exposed through the first pattern in the first direction;
   (b) forming a second layer on the first layer so that the second layer is formed on a top surface of the first layer and fills in the first pattern;
   (c) forming a third layer on a top surface of the second layer, the third layer having at least one mask pattern traversing the first pattern, extending in a second direction, different from the first direction, with a constant second width, and penetrating the third layer so that a top surface of the second layer is exposed through the mask pattern in the second direction;
   (d) patterning the second layer along the mask pattern using the third layer as mask so that the mask pattern penetrates the second layer to form at least one second pattern corresponding to the mask pattern, the top surface of the first layer is exposed through the second pattern, and the top surface of the substrate is exposed through the first pattern and the second pattern;
   (e) removing the third layer;
   (f) forming a first spacer along sidewalls of the first layer and the second layer exposed through the first pattern and the second pattern;
   (g) forming a second spacer along sidewalls of the first spacer;
   (h) removing the first spacer formed above the top surface of the first layer and between the second layer and the second spacer, and the first spacer below the top surface of the first layer and exposed through the first pattern and the second pattern in a plan view;
   (i) removing the second layer and the second spacer formed above a level of the top surface of the first layer;
   (j) removing the first layer, the second layer and the second spacer above a level of the top surface of the substrate; and
   (k) etching the substrate downward except a portion thereof below the first spacer left from operation (j), and removing the first spacer left from operation (j), thereby obtaining the fin structure.

2. The method of claim 1, wherein the first direction and the second direction are substantially perpendicular to each other.

3. The method of claim 1, wherein operation (a) comprises:
   forming the first layer on the top surface of the substrate; and
   patterning the first layer to form the first pattern, and
   wherein the forming the third layer comprises:
   forming the third layer on the top surface of the second layer; and
   patterning the second layer to form the second pattern.

4. The method of claim 1, wherein the second pattern comprises a second-first pattern and a second-second pattern different from each other, and
   wherein the fin structure comprises:
   a first fin structure obtained from the first pattern and the second-first pattern, and having two symmetrical portions separated from each other on the substrate in the plan view; and
   a second fin structure obtained from the first pattern and the second-second pattern, and having two symmetrical portions connected to each other in the plan view thereof.

5. The method of claim 1, wherein, in operation (d), the second layer filled in the first pattern and exposed by the second pattern is removed so that the top surface of the substrate is exposed through the first pattern and the second pattern.

6. The method of claim 1, wherein, in operation (f), the first spacer is formed on all sidewalls of the first layer and the second layer exposed through at least one of the first pattern and the second pattern, and
   wherein, in operation (g), the second spacer is formed on all sidewalls of the first spacer exposed through the second pattern.

7. The method of claim 1, wherein the first spacer formed in operation (f) comprises:
   first portions formed on the substrate, exposed through the first pattern and the second pattern, along the sidewalls of the first layer facing each other in the second direction in the first pattern; and
   second portions formed on the substrate, exposed through the first pattern and the second pattern, along the sidewalls of the second layer facing each other in the first direction in the first pattern,
   wherein the second spacer formed in operation (g) comprises:
   first portions formed on the substrate, exposed through the first pattern and the second pattern, along the sidewalls of the first spacer in the first pattern; and
   second portions formed on the first layer, exposed through the second pattern where the second portions of the first spacer are deposited, along the sidewalls of the second layer exposed through the second pattern.

8. The method of claim 1, wherein the first spacer remaining after operation (h) takes the same shape as the fin structure in the plan view.

9. The method of claim 1, wherein the first layer and the second layer have etch selectivity with respect to each other.

10. The method of claim 1, further comprising planarizing the second layer by chemical mechanical polishing after operation (b) prior to operation (c).

11. A method for manufacturing at least one fin structure of a vertical field effect transistor (VFET), the method comprising:
   (a) stacking, on a substrate, a plurality of layers comprising a lower layer and an upper layer respectively having at least one first pattern and at least one second pattern extending in different directions traversing each other to expose the substrate therethrough;

(b) forming a first spacer on sidewalls of the layers exposed through the first pattern and the second pattern;

(c) forming a second spacer on sidewalls of the first spacer;

(d) removing the first spacer, the second spacer, and the upper layer above a level of a top surface of the lower layer, and the first spacer below the level of the top surface of the lower layer and exposed through the first pattern and the second pattern in a plan view;

(e) removing the layers and the second spacer remaining on the substrate after operation (d); and (f) etching the substrate downward except a portion thereof below the first spacer remaining on the substrate after operation (e), and removing the remaining first spacer, thereby to obtain the fin structure.

12. The method of claim 11, wherein operation (a) comprises:

depositing the lower layer on the substrate and patterning the lower layer to form the first pattern;

depositing the upper layer on the lower layer;

depositing a mask layer on the upper layer, and patterning the mask layer to form at least one mask pattern corresponding to the second pattern; and patterning the upper layer to form the second pattern using the patterned mask layer as mask.

13. The method of claim 11, wherein the second pattern comprises a second-first pattern and a second-second pattern different from each other, and wherein the fin structure comprises:

a first fin structure obtained from the first pattern and the second-first pattern, and having two symmetrical portions separated from each other in the plan view; and a second fin structure obtained from the first pattern and the second-second pattern, and having two symmetrical portions connected to each other in the plan view thereof.

14. The method of claim 13, wherein an area of the lower layer exposed through the second-first pattern is greater than an area of the lower layer exposed through the second-second pattern.

15. The method of claim 14, wherein at least one end of the second-second pattern is closed within the upper layer, wherein an area of the lower layer exposed by the closed end of the second-second pattern is completely covered by the first spacer formed thereon by operation (b).

16. The method of claim 11, wherein operation (d) comprises:

etching away the first spacer formed between the upper layer and the second spacer above the level of the top surface of the lower layer;

etching away the first spacer, in the first pattern, exposed through the first pattern and the second pattern in the first pattern in the plan view; and removing the second spacer and the upper layer above the level of the top surface of the lower layer.

17. The method of claim 11, wherein a width of the first spacer formed on each of the sidewalls of the lower layer in the first pattern is the same as a width of the fin structure in the plan view.

18. The method of claim 11, wherein, in operation (f), the etching the substrate downward is performed by a predetermined depth which defines a height of the fin structure.

* * * * *